United States Patent
Weidman et al.

(10) Patent No.: US 7,888,168 B2
(45) Date of Patent: Feb. 15, 2011

(54) SOLAR CELL CONTACT FORMATION PROCESS USING A PATTERNED ETCHANT MATERIAL

(75) Inventors: Timothy W. Weidman, Sunnyvale, CA (US); Rohit Mishra, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 71 days.

(21) Appl. No.: 12/274,023

(22) Filed: Nov. 19, 2008

(65) Prior Publication Data

US 2009/0142880 A1   Jun. 4, 2009

Related U.S. Application Data

(60) Provisional application No. 61/003,754, filed on Nov. 19, 2007, provisional application No. 61/048,001, filed on Apr. 25, 2008, provisional application No. 61/092,379, filed on Aug. 27, 2008.

(51) Int. Cl.
*H01L 31/18* (2006.01)

(52) U.S. Cl. .................. 438/98; 438/756; 257/E21.246

(58) Field of Classification Search .................. 438/98, 438/756; 257/E21.246
See application file for complete search history.

(56) References Cited

U.S. PATENT DOCUMENTS

| | | |
|---|---|---|
| 3,849,880 A | 11/1974 | Haynos |
| 3,979,241 A | 9/1976 | Maeda et al. |
| 4,084,985 A | 4/1978 | Evans, Jr. |
| 4,104,091 A | 8/1978 | Evens et al. |
| 4,152,824 A | 5/1979 | Gonsiorawski |
| 4,219,448 A | 8/1980 | Ross |
| 4,308,091 A | 12/1981 | Schmitt et al. |
| 4,478,879 A | 10/1984 | Baraona et al. |
| 4,623,751 A | 11/1986 | Kishi et al. |
| 4,717,591 A | 1/1988 | Acosta et al. |
| 4,927,770 A | 5/1990 | Swanson |
| 5,011,782 A | 4/1991 | Lamb et al. |

(Continued)

FOREIGN PATENT DOCUMENTS

EP    0 680 099    4/1995

(Continued)

OTHER PUBLICATIONS

Bahr, M. et al, "A New Approach for the Front Side Metallization of Industrial Type Silicon Solar Cells Using a Structuization by Etching", 22nd EU-PVSEC, paper 2DO.2.2, Sep. 2007.*

(Continued)

*Primary Examiner*—George Fourson
(74) *Attorney, Agent, or Firm*—Patterson & Sheridan, LLP

(57) ABSTRACT

Embodiments of the invention contemplate the formation of a high efficiency solar cell using novel methods to form the active region(s) and the metal contact structure of a solar cell device. In one embodiment, the methods include the use of various etching and patterning processes that are used to define point contacts through a blanket dielectric layer covering a surface of a solar cell substrate. The method generally includes depositing an etchant material that enables formation of a desired pattern in a dielectric layer through which electrical contacts to the solar cell device can be formed.

23 Claims, 6 Drawing Sheets

U.S. PATENT DOCUMENTS

| | | | |
|---|---|---|---|
| 5,198,385 | A | 3/1993 | Devitt et al. |
| 5,248,496 | A | 9/1993 | Schuster et al. |
| 5,281,350 | A | 1/1994 | Gimm et al. |
| 5,401,336 | A | 3/1995 | Noguchi et al. |
| 5,698,451 | A | 12/1997 | Hanoka |
| 5,705,828 | A | 1/1998 | Noguchi et al. |
| 5,897,368 | A | 4/1999 | Cole, Jr. et al. |
| 5,939,336 | A | 8/1999 | Yates |
| 6,020,250 | A | 2/2000 | Kenney |
| 6,036,741 | A | 3/2000 | Shindo et al. |
| 6,066,267 | A | 5/2000 | Rath et al. |
| 6,082,610 | A | 7/2000 | Shangguan et al. |
| 6,091,099 | A | 7/2000 | Kiyotoshi et al. |
| 6,096,968 | A | 8/2000 | Schlosser et al. |
| 6,103,393 | A | 8/2000 | Kodas et al. |
| 6,290,880 | B1 | 9/2001 | Ryan et al. |
| 6,328,913 | B1 | 12/2001 | Shaffer et al. |
| RE37,512 | E | 1/2002 | Szlufcik et al. |
| 6,451,665 | B1 | 9/2002 | Yunogami et al. |
| 6,458,183 | B1 | 10/2002 | Phillips et al. |
| 6,537,461 | B1 | 3/2003 | Nakahara et al. |
| 6,552,414 | B1 | 4/2003 | Horzel et al. |
| 6,586,161 | B2 | 7/2003 | Futase et al. |
| 6,607,988 | B2 | 8/2003 | Yunogami et al. |
| 6,649,091 | B2 | 11/2003 | Ryan et al. |
| 6,649,211 | B2 | 11/2003 | Lyons et al. |
| 6,695,903 | B1 | 2/2004 | Kubelbeck et al. |
| 6,737,221 | B2 | 5/2004 | Futase et al. |
| 6,753,133 | B2 | 6/2004 | Ono et al. |
| 6,800,542 | B2 | 10/2004 | Kim |
| 6,825,104 | B2 | 11/2004 | Horzel et al. |
| 6,852,635 | B2 | 2/2005 | Satta et al. |
| 6,998,288 | B1 | 2/2006 | Smith et al. |
| 7,129,109 | B2 * | 10/2006 | Munzer et al. ............... 438/98 |
| 7,135,350 | B1 | 11/2006 | Smith et al. |
| 7,186,358 | B2 | 3/2007 | McCulloch et al. |
| 7,196,018 | B2 | 3/2007 | Szlufcik et al. |
| 7,242,632 | B2 | 7/2007 | Hiraka |
| 7,375,378 | B2 | 5/2008 | Manivannan et al. |
| 7,432,438 | B2 | 10/2008 | Rubin et al. |
| 7,510,672 | B2 | 3/2009 | McCulloch et al. |
| 2002/0041991 | A1 | 4/2002 | Chan et al. |
| 2002/0176927 | A1 | 11/2002 | Kodas et al. |
| 2002/0184969 | A1 | 12/2002 | Kodas et al. |
| 2003/0134469 | A1 | 7/2003 | Horzel et al. |
| 2003/0160026 | A1 | 8/2003 | Klein et al. |
| 2003/0207214 | A1 | 11/2003 | Futase et al. |
| 2004/0013799 | A1 | 1/2004 | Kim et al. |
| 2004/0063326 | A1 | 4/2004 | Szlufcik et al. |
| 2004/0112426 | A1 | 6/2004 | Hagino |
| 2004/0113277 | A1 | 6/2004 | Chiras et al. |
| 2004/0126644 | A1 | 7/2004 | Bett et al. |
| 2004/0159869 | A1 | 8/2004 | Rinerson et al. |
| 2004/0242019 | A1 | 12/2004 | Klein et al. |
| 2005/0009346 | A1 | 1/2005 | Miyajima |
| 2005/0089748 | A1 | 4/2005 | Ohlsen et al. |
| 2005/0110125 | A1 | 5/2005 | Blackshear |
| 2005/0224968 | A1 | 10/2005 | Ho |
| 2005/0238808 | A1 | 10/2005 | Gatineau et al. |
| 2005/0247674 | A1 * | 11/2005 | Kubelbeck et al. ............ 216/92 |
| 2006/0174933 | A1 | 8/2006 | Rolison et al. |
| 2006/0283499 | A1 | 12/2006 | Terakawa et al. |
| 2007/0099806 | A1 | 5/2007 | Stewart et al. |
| 2007/0111354 | A1 | 5/2007 | Seong et al. |
| 2007/0148336 | A1 | 6/2007 | Bachrach et al. |
| 2007/0148810 | A1 | 6/2007 | Klein et al. |
| 2007/0181908 | A1 | 8/2007 | Otremba |
| 2007/0194467 | A1 | 8/2007 | Yang et al. |
| 2008/0121621 | A1 | 5/2008 | Stockum et al. |
| 2008/0145708 | A1 | 6/2008 | Heil et al. |
| 2008/0152835 | A1 | 6/2008 | Mayers et al. |
| 2008/0200036 | A1 | 8/2008 | Stockum et al. |
| 2008/0210298 | A1 | 9/2008 | Kuebelbeck et al. |
| 2008/0210660 | A1 | 9/2008 | Stockum et al. |
| 2008/0217576 | A1 | 9/2008 | Stockum et al. |
| 2009/0008787 | A1 | 1/2009 | Wenham |
| 2009/0071540 | A1 | 3/2009 | Klein et al. |
| 2009/0142880 | A1 | 6/2009 | Weidman et al. |
| 2009/0305456 | A1 * | 12/2009 | Funakoshi ................... 438/98 |
| 2010/0059117 | A1 | 3/2010 | Shi et al. |
| 2010/0068889 | A1 | 3/2010 | Stockum et al. |
| 2010/0068890 | A1 | 3/2010 | Stockum et al. |

FOREIGN PATENT DOCUMENTS

| | | |
|---|---|---|
| EP | 1 390 987 | 11/2006 |
| JP | 6097153 | 4/1994 |
| WO | WO 02/061854 | 8/2002 |
| WO | WO 2004/021455 | 3/2004 |
| WO | WO 2004/042828 A2 | 5/2004 |
| WO | WO 2007/071064 | 6/2007 |
| WO | WO 2007/095757 | 8/2007 |
| WO | WO 2007/137407 | 12/2007 |
| WO | WO 2008/046201 | 4/2008 |
| WO | WO 2008/070087 | 6/2008 |

OTHER PUBLICATIONS

Neckerman, K. et al, "Local Structuring of Dielectric Layers on Silicon for Improved Solar Cell Metallization", 22nd EU-PVSEC, paper 2DV.2.8, Sep. 2007.*

International Search Report. Jan. 5, 2009. PCT/US 08/83981.

International Search Report. Jan. 14, 2009. PCT/US2008/083968.

SolarEtch. "New Structuring Concepts for Solar Cell Production Easy, Fast and Environmentally Friendly", www.isishape.com. Published Feb. 2003.

Colomer, et al., "Structural, Microstructural, and Electrical Transport Properties of $TiO_2$—$RuO_2$ Ceramic Materials Obtained by Polymeric Sol-Gel Route," Chem. Mater. 2000, 12, pp. 923-930.

Denissov, et al. "RIE—Textured Silicon Solar Cells with Screen Printed Metallization", p. 64-66. 2003.

Curtis, C. J. et al., "Direct-Write Printing of Silver Metallizations on Silicon Solar Cells", Materials Research Society 2002, Mat. Res. Soc. Symp. Proc. vol. 730, pp. V3.8.1-V3.8.6.

Erler, et al. "Solar Cell Processing Steps Applied to RIE Textured Silicon Surfaces." Chemnitz University of Technology, Center for Microtechnologies Annual Report. 2002.

Paunovic, Milan "Electrochemically Deposited Thin Films" The Electrochemical Society, Inc., Electrodeposition Division Proceedings vol. 94-31. pp. 293-303. 1995.

Shacham-Diamand, et al. "Integrated Electroless Metallization for ULSI" Electrochimica Acta 44 (1999) 3639-3649.

Sankar, et al. "Low Temperature Chemical Vapour Deposition of Ruthenium and Ruthenium Dioxide on Polymer Surfaces" Journal of Materials Chemistry 9 (1999), 2439-2444.

Swider-Lyons, et al. "Selective Vapor Deposition of Hydrous $RuO2$ Thin Films", Journal of The Electrochemical Society, 152-3 (2005) C158-C162.

Shih, C.H., et al. "Direct Plating of Cu on ALD TaN for 45nm-node Cu BEOL Metallization". IEEE, 2004.

Herlitz, Fredrik "Titanium in the electrochemical industry—use and protection" Permascand AB, Sweden 2004.

Lindholm, et al. "Heavily Doped Polysilicon-Contact Solar Cells," IEEE Electron Device Letters, vol. EDL—6, No. 7, Jul. 1985.

Buhler, et al. "Silicon Dioxide Sacrificial Layer Etching in Surface Micromachining," 1997. Physical Electronics Laboratory.

Lennon, et al. "Direct Patterned Etching of Silicon Dioxide and Silicon Nitride Dielectric Layers," Solar Energy Materials & Solar Cells. 2009.

Isishape. "Structuring Solutions for economical and environmentally-friendly processes for solar cell and display fabrication", Jul. 14, 2009.

Mitchell, et al. "Plasma-Enhanced Chemical Vapour Deposition of a Si:H to Provide Surface Passivation of C-SI Surfaces at Low Temperature", 22$^{nd}$ European Photovoltaic Solar Energy Conference, Sep. 3-7, 2007, Milan, Italy. pp. 928-931.

Veschetti, et al. "Fabrication of Interdigited Back Contact Solar Cells on Large Area with Screen Printed Metallization", 22$^{nd}$ European Photovoltaic Solar Energy Conference, Sep. 3-7, 2007, Milan, Italy. pp. 1179-1182.

Ribeyron, et al. "Polymorphous/Crystalline Silicon Heterojuction Solar Cells: Optimisation of P-Type Monocrystalline Silicon", 22$^{nd}$ European Photovoltaic Solar Energy Conference, Sep. 3-7, 2007, Milan, Italy. pp. 1197-1200.

Birmann, et al. "Fast Alkaline Etching of Monocrystalline Wafers in KOH/CHX", Presented at the 23$^{rd}$ European Photovoltaic Solar Energy Conference and Exhibition, Sep. 1-5, 2008, Valencia, Spain.

Bueno, et al. "Simultaneous Diffusion of Screen Printed Boron and Phosphorus Paste for Bifacial Silicon Solar Cells", 2005.

Lohmann, et al. "Report on Industrial Use of Inline Wet Edge Isolation for Solar Cell Production", 22$^{nd}$ European Photovoltaic Solar Energy Conference, Sep. 3-7, 2007, Milan, Italy. pp. 1634-1635.

Garben, et al. "Investigation of Boron Diffusion from Polycrystalline Silicon", IBM East Fishkill Facility, Hopewell Junction, New York 12533. Oct. 1986. pp. 2152-2156.

Uzum. et al. "Effect of Boron-Diffusion on the Electrical Properties of N-Type Multicrystalline Silicon Wafers", Proc. 23rd European Photovoltaic Solar Energy Conference, Sep. 2008.

Recart, et al. "Bifacial Thin Solar Cells With Screen Printed Emitters and Metallizations", 23rd European Photovoltaic Solar Energy Conference and Exhibition, Sep. 1-5, 2008, Valencia, Spain. Session: 2DV.1.16. pp. 1893-1896.

Vitanov, et al. "A Study of Sol-Gel Deposited Al2O3 Films as Passivating Coatings for Solar Cells Application", 23rd European Photovoltaic Solar Energy Conference and Exhibition, Sep. 1-5, 2008, Valencia, Spain. Session: 2CV.5.5. pp. 1596-1599.

Kohler, et al. "New Inkjet Solution for Direct Printing of Local Diffusion Barriers on Solar Cells", 23$^{rd}$ EUPVSEC (Valencia, Spain), 2008.

Morilla, et al. "Laser Induced Ablation and Doping Processes on High Efficiency Silicon Solar Cells", 23rd EUPVSEC (Valencia, Spain), 2008.

* cited by examiner

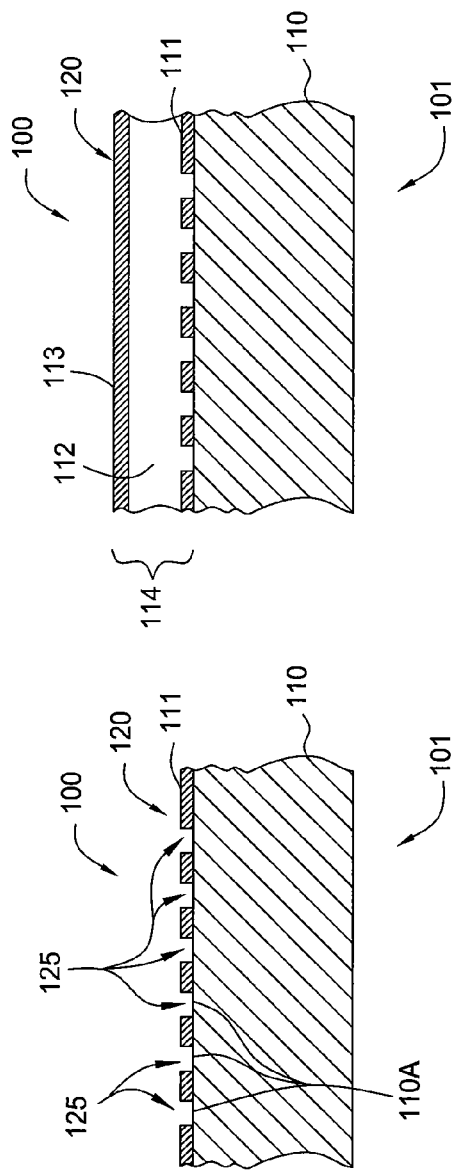
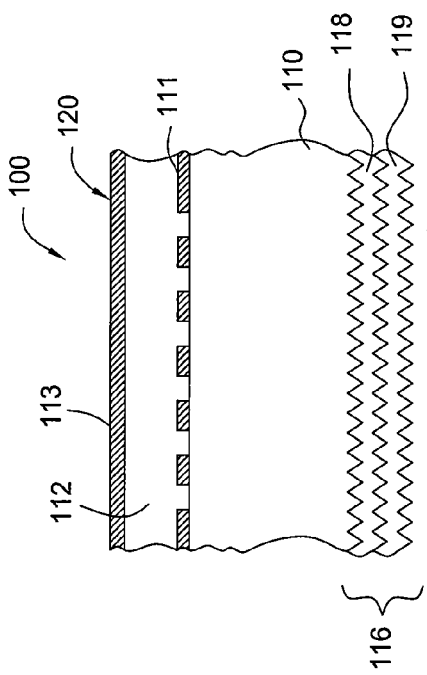

SOLAR CELL CONTACT FORMATION PROCESS USING A PATTERNED ETCHANT MATERIAL

CROSS-REFERENCE TO RELATED APPLICATIONS

This application claims benefit of U.S. Provisional Patent Application Ser. No. 61/003,754, filed Nov. 19, 2007, U.S. Provisional Patent Application Ser. No. 61/048,001, filed Apr. 25, 2008, and U.S. Provisional Patent Application Ser. No. 61/092,379, filed Aug. 27, 2008, which are all herein incorporated by reference.

BACKGROUND OF THE INVENTION

1. Field of the Invention

Embodiments of the invention generally relate to the fabrication of photovoltaic cells.

2. Description of the Related Art

Solar cells are photovoltaic devices that convert sunlight directly into electrical power. The most common solar cell material is silicon, which is in the form of single or multicrystalline substrates, sometimes referred to as wafers. Because the amortized cost of forming silicon-based solar cells to generate electricity is higher than the cost of generating electricity using traditional methods, there has been an effort to reduce the cost to form solar cells.

Various approaches enable fabricating active regions of the solar cell and the current carrying metal lines, or conductors, of the solar cells. However, there are several issues with these prior manufacturing methods. For example, the formation processes are complicated multistep processes that add to costs required to complete the solar cells.

Therefore, there exists a need for improved methods and apparatus to form the active and current carrying regions formed on a surface of a substrate to form a solar cell.

SUMMARY OF THE INVENTION

The present invention generally provides a method of forming a solar cell device, comprising forming a dielectric layer on a surface of a substrate, disposing an etchant material on a plurality of regions of the dielectric layer, heating the substrate to a desired temperature to causes the etchant material to remove at least a portion of the dielectric layer in the plurality of regions to expose a plurality of regions of the surface of the substrate, and depositing a conducting layer on the exposed regions of the surface. Embodiments of the method may further provide a process sequence where a conducting layer is deposited on the exposed regions of the surface substantially after heating the substrate to a desired temperature, so that no other major solar cell formation processes are performed between these process steps. For example, no wet processing steps are performed on the substrate between the heating of the substrate and the depositing a conducting layer processes.

The present invention also provides a method of forming a method of forming a solar cell device, comprising forming a dielectric layer on at least one surface of a substrate, wherein the dielectric layer contains one or more doping elements, disposing an etchant material on a plurality of regions of the dielectric layer, wherein the etchant material comprises ammonium fluoride, heating the substrate to a desired temperature to causes the etchant material to remove at least a portion of the dielectric layer, and depositing a conducting layer on the silicon containing region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

FIGS. 1A-1G illustrate schematic cross-sectional views of a solar cell during different stages in a sequence according to one embodiment of the invention.

For clarity, identical reference numerals have been used, where applicable, to designate identical elements that are common between figures. It is contemplated that features of one embodiment may be incorporated in other embodiments without further recitation.

DETAILED DESCRIPTION

Figure 1A:
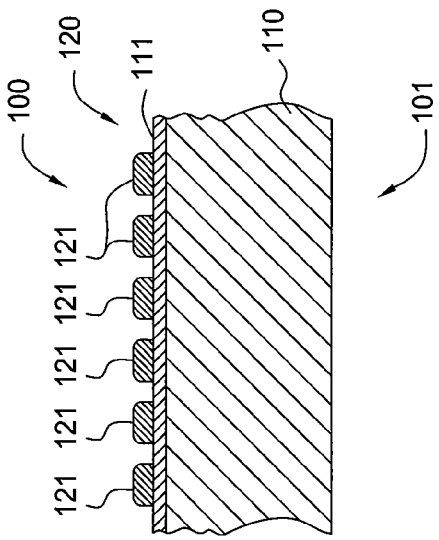

Embodiments of the invention contemplate the formation of a high efficiency solar cell using novel methods to form the active region(s) and the metal contact structure of a solar cell device. In one embodiment, the methods include the use of various etching and patterning processes that are used to define point contacts through a blanket dielectric layer covering a surface of a solar cell substrate. The method generally includes depositing an etchant material that enables formation of a desired pattern in a dielectric layer through which electrical contacts to the solar cell device can be formed. Various techniques may be used to form the active regions of the solar cell and the metal contact structure. Solar cell substrates (e.g., substrate 110 in FIG. 1A) that may benefit from the invention include flexible substrates that may have an active region that contains organic material, single crystal silicon, multi-crystalline silicon, polycrystalline silicon, germanium (Ge), gallium arsenide (GaAs), cadmium telluride (CdTe), cadmium sulfide (CdS), copper indium gallium selenide (CIGS), copper indium selenide (CuInSe$_2$), gallium indium phosphide (GaInP$_2$), as well as heterojunction cells, such as GaInP/GaAs/Ge or ZnSe/GaAs/Ge substrates, that are used to convert sunlight to electrical power. In one embodiment, substrate 110 comprises a p-n junction type structure similar to the type illustrate within substrate 310, which is discussed below in conjunction with FIGS. 4A-4D, and has a dielectric layer (e.g., reference numerals 111 or 311) formed thereon.

Solar Cell Formation Process

FIGS. 1A-1G illustrate schematic cross-sectional views of a solar cell substrate 110 during different stages in a processing sequence used to form a contact structure on a surface 120 of the solar cell 100. FIG. 2 illustrates a process sequence 200 used to form the active region(s) and/or contact structure on a solar cell. The sequence found in FIG. 2 corresponds to the stages depicted in FIGS. 1A-1G, which are discussed herein.

Figure 2:
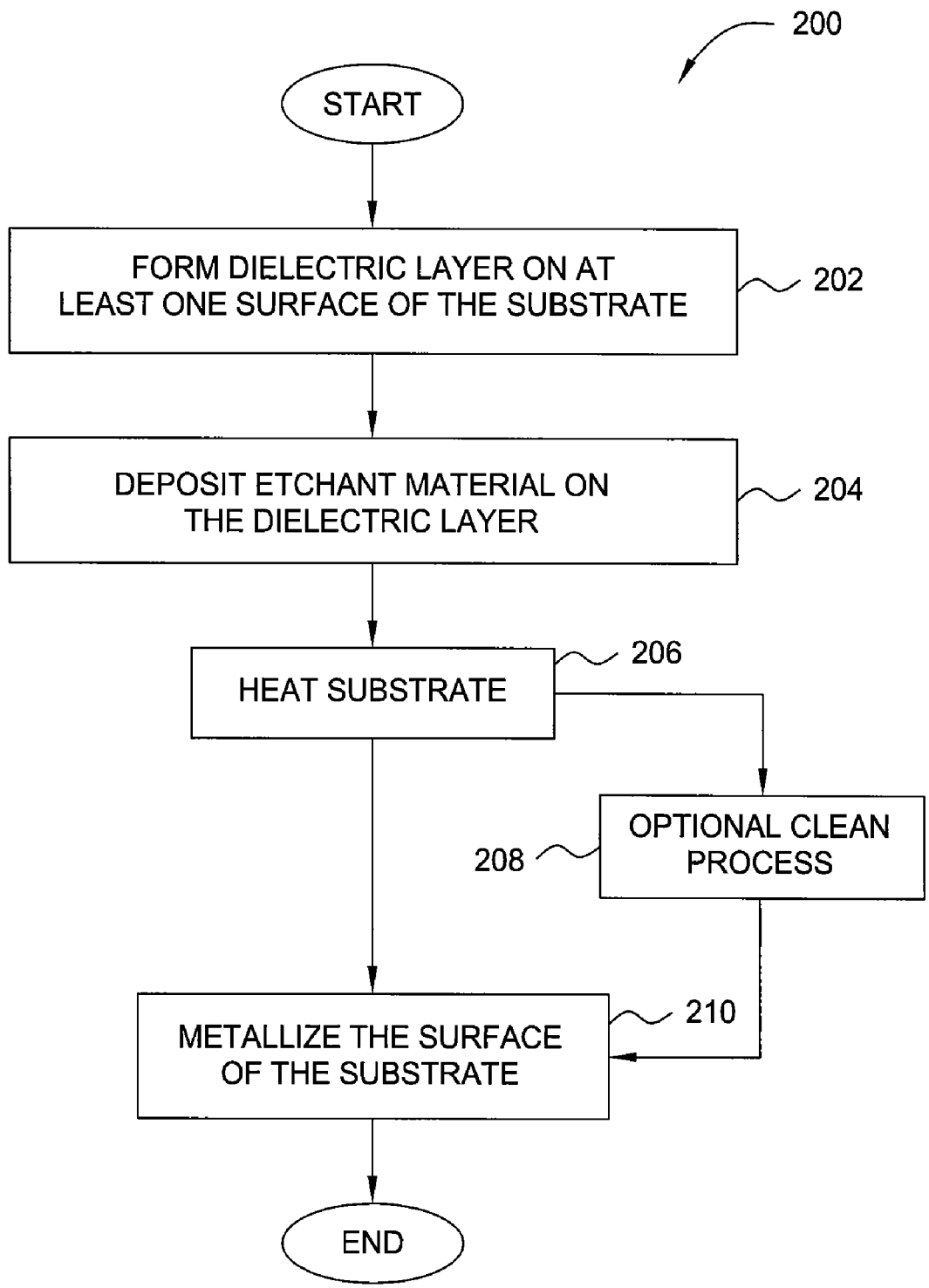
FIG. 2 illustrates a flow chart of methods to metalize a solar cell according to embodiments of the invention.

At box 202, as shown in FIG. 1A, a dielectric layer 111 is formed on at least one surface of the substrate 110. In one embodiment, the dielectric layer 111 is a silicon oxide layer, such as a silicon dioxide layer, formed on the surface 120 of a silicon containing substrate. The silicon oxide containing dielectric layer 111 may be formed using a conventional thermal oxidation process, such a furnace annealing process, a rapid thermal oxidation process, an atmospheric pressure or low pressure CVD process, a plasma enhanced CVD process, a PVD process, or applied using a sprayed-on, spin-on, roll-on, screen printed, or other similar type of deposition process. In one embodiment, the dielectric layer 111 is a silicon dioxide layer that is between about 50 Å and about 3000 Å thick. In another embodiment the dielectric layer is a silicon dioxide layer that is less than about 2000 Å thick. In one embodiment, the surface 120 is the backside of a formed solar cell device. It should be noted that the discussion of the formation of a silicon oxide type dielectric layer is not intended to be limiting as to the scope of the invention described herein since the dielectric layer 111 could also be formed using other conventional deposition processes (e.g., PECVD deposition) and/or be made of other dielectric materials. In one embodiment, the dielectric layer 111 is a silicon nitride layer having a thickness between about 100 Å and about 1000 Å, which is formed on the surface 120 of a silicon containing substrate. In one embodiment, the silicon oxide or silicon nitride formation process is performed in a Vantage RadiancePlus™ RTP, Vantage RadOX™ RTP, or Applied Producer DARC®, or other similar chamber available from Applied Materials Inc. of Santa Clara, Calif.

In another embodiment, the dielectric layer 111 comprises a multilayer film stack, such as a silicon oxide/silicon nitride layer stack (e.g., a silicon oxide layer (e.g., layer(s) ~20 Å to ~3000 Å thick) and a silicon nitride layer (e.g., layer(s) ~100 Å to ~1000 Å thick)), an amorphous silicon/silicon oxide layer stack (e.g., amorphous silicon layer (e.g., ~30 to 100 Å thick) and silicon oxide layer (e.g., ~100 to 3000 Å thick)), or an amorphous silicon/silicon nitride stack (e.g., amorphous silicon layer (e.g., ~30 to 100 Å thick) and silicon nitride layer (e.g., ~100 to 1000 Å thick)). In one example, a 50 Å amorphous silicon layer is deposited on a silicon substrate using a CVD process, and then a 750 Å silicon nitride layer is deposited using a CVD or PVD process. In another example, a 50 Å silicon oxide layer is formed using a rapid thermal oxidation process on a silicon substrate, and then a 750 Å silicon nitride is deposited on the silicon oxide layer using a CVD or PVD process. An example of a deposition chamber and/or process that may be adapted to form an amorphous silicon layer, silicon nitride, or silicon oxide discussed herein are further discussed in the commonly assigned and copending U.S. patent application Ser. Nos. 12/178,289, filed Jul. 23, 2008, and the commonly assigned U.S. patent application Ser. No. 12/202,213, filed Aug. 29, 2008, which are both herein incorporated by reference in their entirety.

Figure 1C:
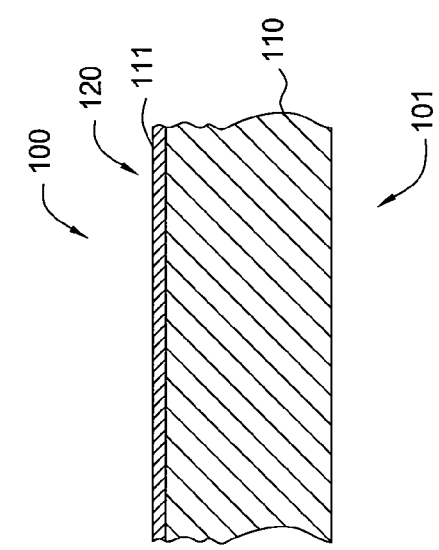
Figure 1B:
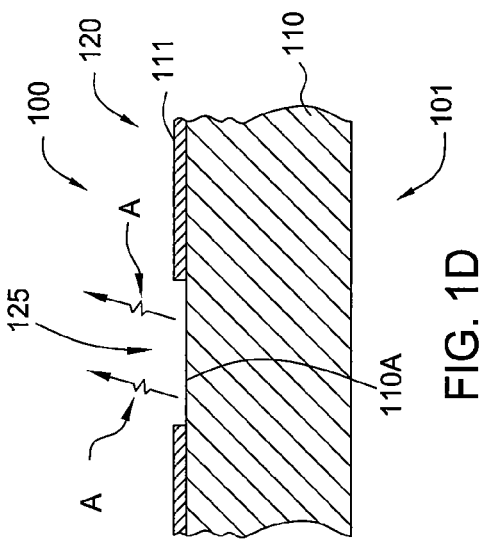
Figure 1D:
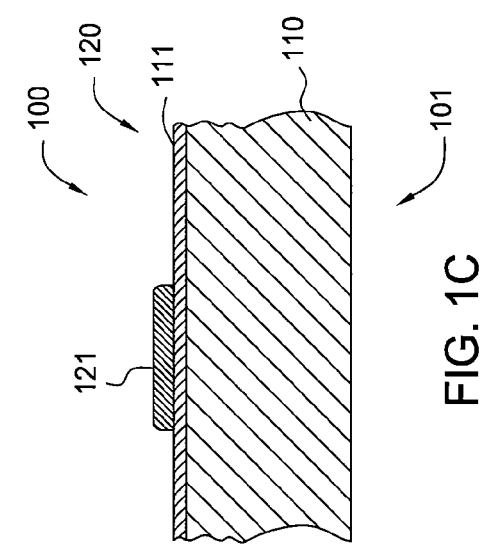

At box 204, an etchant material 121 is selectively deposited on the dielectric layer 111 by use of a conventional ink jet printing, rubber stamping, screen printing, or other similar process to form and define a desired pattern where electrical contacts to the underlying substrate surface (e.g., silicon) are to be formed (FIG. 1B). In one embodiment, the etchant material is disposed on the dielectric layer 111 by a screen printing process in which the etchant material is printed through a polyester mask that has an array of features ranging in size from about 100 to about 1000 μm in size that are placed on less than 2 mm centers. In one example, the features are circular holes, slots, rectangular shaped holes, hexagonal shaped holes, or other desirable shape that are to be formed in the dielectric layer 111. In one example, the etchant material is printed through a polyester mask that has an array of features that are greater than about 100 μm in size and are placed on less than about 1-2 mm centers. In another example, the features that are less than about 1000 μm in size and are placed on less than about 1-2 mm centers. In one example, the screen printing process is performed in a SoftLine™ available from Baccini S.p.A, which is a division of Applied Materials Inc. of Santa Clara, Calif.

In one embodiment, etchant material 121 is an ammonium fluoride ($NH_4F$) containing material that is formulated to etch the dielectric layer 111. In one example, the etchant material contains: 200 g/l of ammonium fluoride ($NH_4F$), 50 g/l of 2000 MW polyethylene glycol (PEG) and 50 g/l of ethyl alcohol with the remainder of the 1 liter volume being DI water. FIG. 1C illustrates a close up view of an amount of the etchant material 121 that has been deposited on the dielectric layer 111. In another example, one liter of the etchant material contains: 90 milliliters of a 6:1 BOE etching solution, 5 g of 500 MW polyethylene glycol (PEG) and 5 g of ethyl alcohol with the remainder of the volume being DI water. Additional components in the etching solution are generally selected so as to promote effective "wetting" of the dielectric layer 111 while minimizing the amount of spreading that can affect the formed pattern in the dielectric layer 111. While polyethylene oxide (i.e., polyethylene glycol) based materials and other related materials work well as a surfactant in the etchant material, they also decompose at temperatures over 250° C. to form volatile byproducts thereby avoiding the need for a post-rinse step to clean the substrate surface after heating the substrate in the next step.

In one embodiment, the etchant material 121 comprises ammonium fluoride ($NH_4F$), a solvent that forms a homogeneous mixture with ammonium fluoride, a pH adjusting agent (e.g., BOE, HF), and a surfactant/wetting agent. In one example, the solvent is dimethylamine, diethylamine, triethylamine or ethanolamine that are disposed in an aqueous solution. In general, any other amine that will forms a homogeneous mixture with ammonium fluoride can also be used. In one example, the surfactant/wetting agent may be polyethylene glycol (PEG), polypropylene glycol, polyethylene glycol-polypropylene glycol-block-copolymer, or glycerin. In general, any other surfactant that mixes homogeneously with ammonium fluoride and the solvent mixture, and also "wets" the dielectric surface can be used. In some cases, it is desirable to form an etch material 121 that remains an amorphous gel, and is generally not prone crystallizing. In one example, the etchant material 121 comprises 20 g of ammonium fluoride that is mixed together with 5 ml of dimethylamine, and 25 g of glycerin, which is then heated to 100° C. until the pH of the mixture reaches about 7 and a homogeneous mixture is formed. In another example, 5 g of ammonium fluoride and 5 ml of ethanolamine were mixed together. Then 2 ml of hydrofluoric acid (HF) is added to the ammonium fluoride and ethanolamine mixture to bring down the pH to about 7, and then 2 g of polyethylene glycol-polypropylene glycol-block-copolymer was added. It is believed that one benefit of using an alkaline chemistry is that no volatile HF vapors will be generated until the subsequent heating process(es) begins to drive out the ammonia ($NH_3$), thus reducing the need for expensive and complex ventilation and handling schemes prior to performing the heating process(es).

At box 206, the substrate is heated to a temperature of between about 200-300° C. which causes the chemicals in the etchant material to etch the dielectric layer 111 formed on the substrate to form the exposed regions 125 on the substrate 110. The exposed regions 125 provide openings in the dielectric layer 111 through which electrical connections can be made to the substrate 110. In one embodiment the exposed regions 125 on the surface of the substrate are between about 5 μm and about 200 μm in diameter. It is believed that by exposing a silicon oxide containing dielectric layer 111 (e.g., 1000 Å thick) to an etchant material 121 that contains ammonium fluoride ($NH_4F$) at a temperature in a range between 100-300° C. for about 2 minutes that the dielectric layer 111 is etched to produce volatile etch products which evaporate from the surface (e.g., reference numeral "A" in FIG. 1D) of the substrate 110 during processing. In one example, the substrate is placed in a thermal processing chamber in which a gradual temperature ramp between 50° C. and 300° C. is applied to the substrate over a 6 minute cycle to etch the dielectric layer 111. Therefore, after processing for a desired period of time (e.g., ~2 minutes) at a desired temperature the volatile etch products will be removed and a clean surface 110A is left within the exposed regions 125 so that a reliable backside electrical contact can be formed in these areas. It is believed that the reaction will follow the following equation (1).

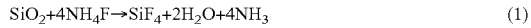

$$SiO_2 + 4NH_4F \rightarrow SiF_4 + 2H_2O + 4NH_3 \quad (1)$$

FIG. 1E illustrates the patterned dielectric layer 111 formed after performing the steps found in boxes 202-206 shown in FIGS. 1A-1D and 2. One desirable aspect of the process sequence and etchant formulations discussed herein is the ability to form the exposed regions 125 in the dielectric layer 111 without the need to perform any post cleaning processes due to the removal of the etching products and residual etchant material by evaporation, thus leaving a clean surface that can be directly metalized following the processes at box 210. Therefore, in one embodiment, the process sequence includes forming the exposed regions 125 in the dielectric layer 111 and then proceeding with the step(s) of depositing a conducting layer 114 (box 210). In some cases it is desirable to avoid extended waiting periods, or performing other long intermediate processing steps, between box 206 and box 210 to prevent a substantial oxide layer (e.g., $SiO_2$) from forming on the exposed substrate (e.g., crystalline silicon substrate) surfaces before the conducting layer 114 is deposited thereon. In some cases it is desirable to avoid performing wet processing steps between boxes 206 and 210 to avoid the added time required to rinse and dry the substrate, the increase in cost-of-ownership associated with performing wet processing steps, and the added chance of oxidizing or contaminating the exposed regions 125.

However, in one embodiment, an optional cleaning process, shown at box 208, is performed on the substrate 110 after the process performed in box 206 has been completed to remove any undesirable residue and/or form a passivated surface. In one embodiment, the clean process may be performed by wetting the substrate with a cleaning solution that is used to remove left over material from after box 206 and clean the surface of the substrate before the subsequent deposition sequence performed on the various regions of the substrate. Wetting may be accomplished by spraying, flooding, immersing or other suitable technique. The post etch-clean solution may be an SC1 cleaning solution, an SC2 cleaning solution, a dilute HF-last type cleaning solution, an ozonated water solution, a dilute ammonium hydroxide ($NH_4OH$) solution, a hydrogen peroxide ($H_2O_2$) solution, DI water or other suitable and cost effective cleaning process may be used to clean a silicon containing substrate.

At box 210, as illustrated in FIG. 1F, a conducting layer 114 is deposited on the surface 120 of the substrate 110 that electrically connects the exposed regions (e.g., clean surfaces 110A) on the surface of the substrate 110. In one embodiment, the formed conducting layer 114 is between about 500 and about 500,000 angstroms (Å) thick and contains a metal, such as copper (Cu), silver (Ag), tin (Sn), cobalt (Co), rhenium (Rh), nickel (Ni), zinc (Zn), lead (Pb), and/or aluminum (Al). In one embodiment, the conducting layer 114 contains two layers that are formed by first depositing an aluminum (Al) layer 112 by a physical vapor deposition (PVD) process, or evaporation process, and then depositing a nickel vanadium (NiV) capping layer 113 by use of a PVD deposition process. In some cases, when the conducting layer 114 is applied over an interdigitated all back contact solar cell structure, it may be desirable to pattern the deposited conducting layer 114 to form two isolated regions by use of a material removal process, such as laser ablation, patterning and dry etching, or other similar techniques.

In one embodiment, a nickel containing layer is formed on the exposed regions 125 of the substrate 110 by use of an electroless deposition process. An exemplary nickel deposition chemistry, method of depositing, and process of forming a conductive layer is further described in the Provisional Patent Application Ser. No. 61/003,754, filed Nov. 19, 2007, which is incorporated by reference herein. Following the nickel deposition step the other portions of the conducting layer 114 can be formed over the nickel layer.

In one embodiment, an optional thermal processing step is performed after the depositing the conducting layer 114 (i.e., box 210) to assure that a good electrical contact is formed at the interface between the conducting layer 114 and the surface 120. In one embodiment, the substrate is heated to a temperature between about 300° C. and about 800° C. for between about 1 minute and about 30 minutes to form a good ohmic contact (e.g., form a silicide).

Following box 210 various processing steps may be performed to prepare and/or texture the opposing surface 101 of the substrate (FIG. 1G). In one embodiment, the opposing surface 101 of the substrate 110 is the front side of a solar cell substrate that is adapted to receive sunlight after the solar cell has been formed. In one case, opposing surface 101 is textured, then selectively doped using either a spray-on, or vapor phase, high temperature diffusion process, and then passivated using an ARC layer 119 (e.g., silicon nitride). In one embodiment, a heterojunction 116 type solar cell structure having one or more active layers 118 (e.g., i-n type layer on p-type substrate) is formed on the textured opposing surface 101. One will note that the preparation of the opposing surface 101 may also be performed prior to performing the process at box 202, or other steps in the process sequence 200, without deviating from the basic scope of the invention described herein. An example of an exemplary texturizing process is further described in the Provisional Patent Application Ser. No. 61/039,384, filed Mar. 25, 2008, which is incorporated by reference. Also, in one embodiment, after preparing the opposing surface 101 one or more conductive front contact lines (not shown) may be formed thereon using conventional processes to form the front contact structure of the solar cell 100.

Doping Processes

In one embodiment, the processes performed at boxes 202, 204 and/or 206 are altered to provide a process that is used to form a patterned dielectric layer and doped regions at and below the clean surfaces 110A of the substrate 110 (FIGS. 1D-1E) after the process sequence 200 is performed. In general, these techniques are used to form heavily doped regions within the areas of the substrate that are exposed after performing a subsequent high temperature thermal process. In one embodiment, an etching material is disposed over portions of an undoped dielectric layer to etch and form an exposed region that can be easily doped using the processes described herein. The dopant containing material can thus be added to the etchant formulation to increase the dopant concentration in the residue and ultimately the differential degree of doping under the contacts. In this configuration a selectively doped point contact or selective emitter contacts type solar cells can be formed by use of the processes described herein to form higher efficiency solar cells.

In an alternate version of box 202, a dielectric layer 111 is formed that already contains desired amounts of an n-type or p-type dopant atom that remains as a dopant rich residue on the surface after volatilization of the dielectric layer 111 components (e.g., silicon, oxygen). After the dopant residue is formed, the dopant material is driven into the substrate surface during the subsequent high temperature processing step (i.e., box 206). The high concentration of the remaining dopant atoms in the dopant residue can thus be advantageously used to form a heavily doped region by driving the residual doping atoms into the underlying substrate proximate to the formed exposed regions during the subsequent high temperature diffusion step. In some cases careful handling of the substrate may be necessary to prevent some of the lightly adhered dopant residue from being moved to other regions of the substrate surface creating unwanted doped regions after the diffusion step. In one embodiment, the process in box 206 is performed at temperatures greater than about 800° C. in a furnace, or RTP chamber. In another embodiment of the process performed in box 206, a two step heating process is used in which the substrate is first heated to a temperature of about 300° C. for about 1 to 5 minutes, and then heated to a temperature between about 800 and about 1200° C. for a desired period of time to allow the dopant residue to be formed and then the dopant to be driven into the substrate surface. In yet another embodiment of the process performed in box 206, a two step heating process is used in which the substrate is first heated to a temperature of less than about 300° C. for about 1 to 5 minutes, and then heated to a temperature greater than about 800° C. for a desired period of time. Therefore, a highly doped region can be formed at the exposed regions, due to the high concentration of doping atoms in the dopant residue that can relatively easily diffuse into the substrate surface.

In the alternate version of box 204, the etchant material 121 contains an amount of a desired dopant material that can be driven into the clean surfaces 110A of the substrate 110 during the process performed at box 206. As discussed above, in one embodiment, the process performed at box 206 is performed at temperatures greater than about 800° C. in a furnace, or RTP chamber, in the presence of a reducing gas (e.g., forming gas, air or oxygen) to drive-in the dopant material.

In one embodiment of the process sequence 200, the etchant material 121 contains an n-type dopant material, such as a phosphorous (P), antimony (Sb), or arsenic (As) containing compounds that are disposed on the surface of the substrate during the process performed at box 204. The dopant atoms added to the etchant material 121 can be used to form a local n+ region to provide superior electrical contact to an n-type substrate, or n-type diffused region in the substrate 110. In one case, the doping component in the etching material 121 can comprise one of the materials selected from a group consisting of phosphoric acid ($H_3PO_4$), phosphorous acid ($H_3PO_3$), hypophosphorous acid ($H_3PO_2$), ammonium phosphite ($NH_4H_2PO_3$), and ammonium hypophosphite ($NH_4H_2PO_2$).

Alternately, the etchant material 121 may contain a p-type dopant material such as a compound containing boron (B), aluminum (Al), indium (In), or gallium (Ga), so as to generate a local p+ region to provide superior electrical contact to a p-Type substrate, or p-type diffused region in the substrate 110. In one embodiment, the dopant precursor may include boric acid ($H_3BO_3$), ammonium tetrafluoroborate ($NH_4BF_4$), and/or combination thereof.

Alternate Doping Process

In another embodiment of the processes performed at boxes 202, 204 and/or 206, an etching material is applied to a dopant containing dielectric layer, such as the dielectric layer 111 that contains an amount of one or more dopant atoms, before a high temperature thermal processing step is performed, such as a version of step 206. In one example, the dielectric layer is a phosphosilicate glass (PSG) or borosilicate glass (BSG) containing material. Following volatilization of most of the silicon dioxide components by conversion to $SiF_4$ in step 206, due to the reaction of the dielectric material with the etching material, a concentrated residue of the dopant material is formed or remains on the exposed surface. During step 206, or in a subsequent high temperature diffusion step, both the dopant in the (unetched) doped layers, for example, BSG or PSG layers, and the more concentrated dopant residue present at the surface of the etched openings are driven in the solar cell substrate. In one embodiment, the dopant in the etching material contains a dopant of another type (e.g., As, Al, Ga, In) than the dopant contained in the doped dielectric layer (e.g., B, P). Therefore, in one embodiment, a more highly and/or more deeply doped region can be formed at the exposed regions, and a shallower doping profile beneath the unetched doped dielectric layers. It is believed that the deeper doping profile can be achieved at the exposed regions due to the greater concentration of doping atoms at the substrate surface and the relative ease with which the residual dopant atoms can diffuse into the substrate surface versus through the doped layer.

Ink Deposition Process

Figure 3A:
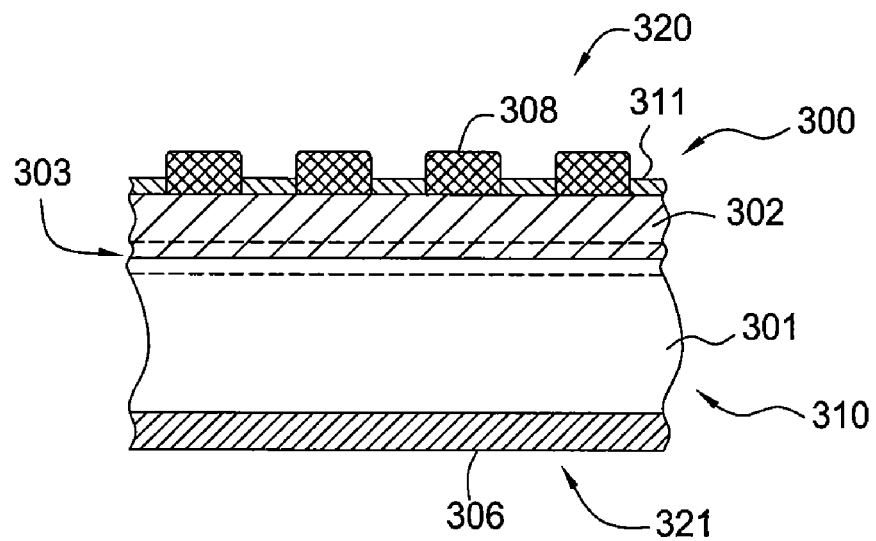
FIG. 3A illustrates a cross-sectional side view of the solar cell having conductive patterns formed on a surface of the substrate according to embodiments of the invention.
Figure 3B:
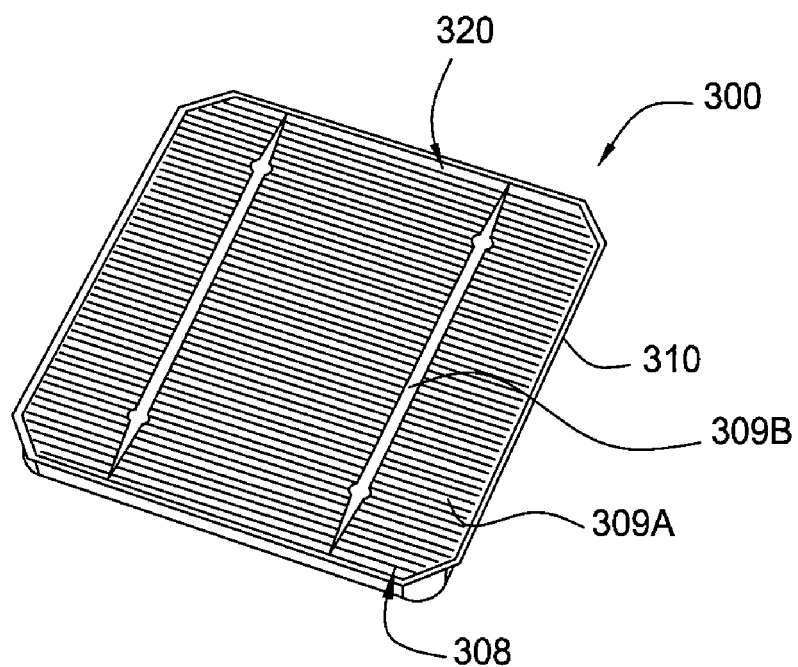
FIG. 3B illustrates an isometric view of the solar cell upon completion with a front side metallization interconnect pattern, according to embodiments of the invention.

FIGS. 3A and 3B schematically depict one embodiment of a silicon solar cell 300 fabricated on a solar cell substrate 310. The substrate 310 includes a p-type base region 301, an n-type emitter region 302, and a p-n junction region 303 disposed therebetween. An n-type region, or n-type semiconductor, is formed by doping the semiconductor with certain types of elements (e.g., phosphorus (P), arsenic (As), or antimony (Sb)) in order to increase the number of negative charge carriers, i.e., electrons. In one configuration, the n-type emitter region 302 is formed by use of an amorphous, microcrystalline or polycrystalline silicon CVD deposition process that contains a dopant containing gas. Similarly, a p-type region, or p-type semiconductor, is formed by the addition of trivalent atoms to the crystal lattice, resulting in a missing electron from one of the four covalent bonds normal for the silicon lattice. Thus, the dopant atom can accept an electron from a neighboring atom's covalent bond to complete the fourth bond. The dopant atom accepts an electron, causing the loss of half of one bond from the neighboring atom and resulting in the formation of a "hole." In one configuration, the p-type base region 301 is a solar cell substrate, such as a crystalline silicon substrate (e.g., single crystal, multicrystalline, polycrystalline) or other similar substrate material as discussed above in conjunction with the substrate 110 in FIG. 1A. The solar cell device configurations illustrated in FIGS. 3A-3B, and other below, are not intended to be limiting as to the scope of the invention since other substrate and solar device region configurations can be metallized using the methods and apparatuses described herein without deviating from the basic scope of the invention.

When sunlight falls on the solar cell 300, energy from the incident photons generates electron-hole pairs on both sides of the p-n junction region 303. Electrons diffuse across the p-n junction to a lower energy level and holes diffuse in the opposite direction, creating a negative charge on the emitter and a corresponding positive charge builds up in the base. When an electrical circuit is made between the emitter and the base and the p-n junction is exposed to certain wavelengths of light, a current will flow. The electrical current generated by the semiconductor when illuminated flows through contacts disposed on the surface 320, i.e. the light-receiving side, and the backside 321 of the solar cell 300. The top contact structure 308, as shown in FIG. 3B, is generally configured as widely-spaced thin metal lines 309A, or fingers, that supply current to larger bus bars 309B transversely oriented to the fingers. The back contact 306 is generally not constrained to be formed in multiple thin metal lines, since it does not prevent incident light from striking the solar cell 300. The solar cell 300 may be covered with a thin layer of dielectric material, such as silicon nitride ($Si_3N_4$) or silicon nitride hydride ($Si_xN_y$:H), to act as an anti-reflection coating layer 311, or ARC layer 311, that minimizes light reflection from the top surface of the solar cell 300. The ARC layer 311 may be formed using a physical vapor deposition (PVD) process, a chemical vapor deposition process, or other similar technique. An anneal step (>600° C.) may be used to further passivate the deposited ARC layer 311.

The contact structure 308 makes contact with the substrate and is adapted to form an ohmic connection with doped region (e.g., n-type emitter region 302). An ohmic contact is a region on a semiconductor device that has been prepared so that the current-voltage (I-V) curve of the device is linear and symmetric, i.e., there is no high resistance interface between the doped silicon region of the semiconductor device and the metal contact. Low-resistance, stable contacts ensure performance of the solar cell and reliability of the circuits formed in the solar cell fabrication process. The back contact 306 completes the electrical circuit required for the solar cell 300 to produce a current by forming a conductive layer that is in ohmic contact with p-type base region 301 of the substrate.

Figure 4B:
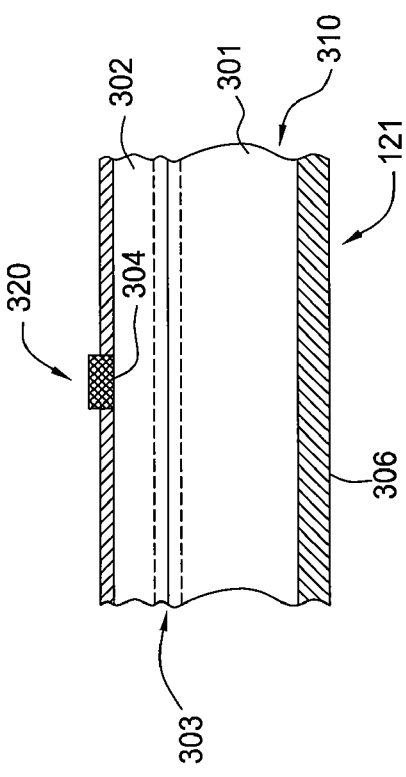
FIGS. 4A-4D illustrate schematic cross-sectional views of a solar cell during different stages in a sequence according to one embodiment of the invention.
Figure 4D:
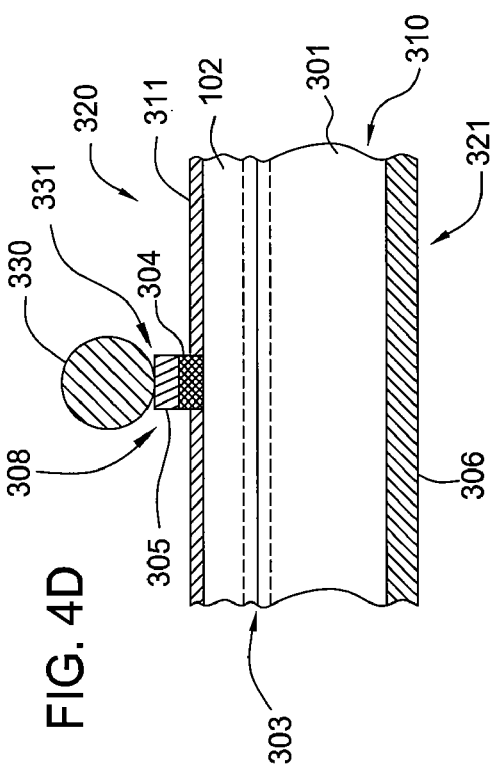
Figure 4A:
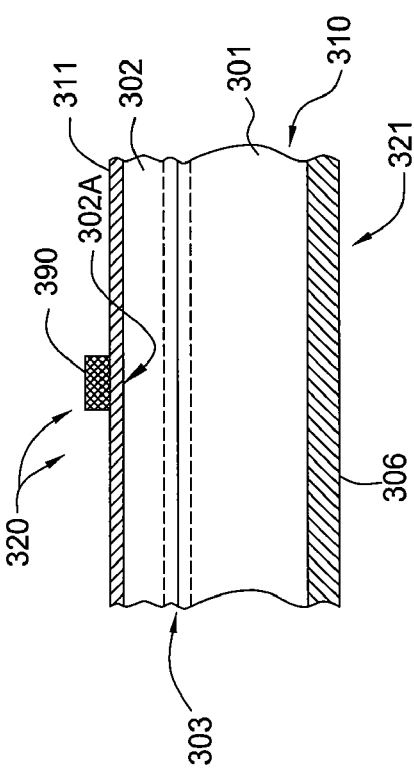

FIGS. 4A-4D illustrate schematic cross-sectional views of a solar cell during different stages in a processing sequence used to form a conductive layer on a surface of the solar cell, such as the contact structure 308 shown in FIG. 3A. FIG. 5 illustrates a process sequence 500, or series of method steps, that are used to form the contact structure 308 on a solar cell. The method steps found in FIG. 5 correspond to the stages depicted in FIGS. 4A-4D, which are discussed herein.

In step 502, as discussed above a solar cell is formed having an arc layer 311 formed on a surface of the substrate 310 (See FIGS. 3A and 4A) via conventional means. It should be noted that the back contact 306 (FIG. 3A), as in any of the steps discussed above, need not be formed prior to metalizing a portion of the surface 320 of the substrate 310.

In the next step, or step 504, a metal containing ink 390 material is selectively deposited on the ARC layer 311 by use of a conventional ink jet printing, screen printing, rubber stamping or other similar process to form and define the regions where the contact structure 308 (i.e., fingers 309A and bus bars 309B) are to be formed. In one embodiment, metal containing ink 390 is a nickel containing ink that is formulated to etch the ARC layer 311 and metalize the underlying surface 302A of the substrate 310. In one embodiment, the nickel containing ink contains: 10 grams of nickel acetate ($Ni(OOCCH_3)_2.4H_2O$), 10 grams of 42% hypophosphorous acid ($H_3PO_2$), 10 grams of polyphosphoric acid ($H_6P_4O_{13}$), 3 grams of ammonium fluoride ($NH_4F$) and 2 g of 500 MW Polyethylene glycol (PEG). In another embodiment, the nickel containing ink primarily contains: 10 grams of nickel acetate ($Ni(OOCCH_3)_2.4H_2O$), 10 grams of 42% hypophosphorous acid ($H_3PO_2$), and 3 grams of ammonium fluoride ($NH_4F$). In one embodiment, it may be desirable to add a desirable amount of methanol or ethanol to the nickel containing solution.

In the contact layer formation step, or step 506, the substrate is heated to a temperature of between about 250-300° C. which causes the chemicals in the metal containing ink 390 to etch the ARC layer 311 and metalize the underlying surface 302A of the substrate. In one embodiment, the process of heating a nickel containing metal containing ink 390 causes a silicon nitride (SiN) containing ARC layer 311 to be etched and a nickel silicide ($Ni_xSi_y$) to form on the surface of upper surface of the substrate 310, such as the n-type emitter region 302. FIG. 4B illustrates a contact layer 304 formed on the n-type emitter region 302. In one embodiment, an electroless nickel deposition process is used to form the contact layer 304 that comprises a primarily nickel layer that is between about 10 and about 2000 angstroms (Å) thick.

In one embodiment, an optional cleaning process is performed on the substrate 310 after the process performed in box 506 has been completed to remove any undesirable residue and/or form a passivated surface. In one embodiment, the clean process may be performed by wetting the substrate with a cleaning solution to remove any left over material after performing the processes in box 506. In one example, it may be desirable to remove the residue from the metal containing ink 390, such as residue from the etched ARC layer 311, polyphosphoric acid residue and/or PEG residue. Wetting may be accomplished by spraying, flooding, immersing of other suitable technique. The cleaning solution may be a SC1 cleaning solution, an SC2 cleaning solution, a dilute HF-last type cleaning solution, an ozonated water solution, a dilute ammonium hydroxide ($NH_4OH$) solution, a hydrogen peroxide ($H_2O_2$) solution, DI water or other suitable and cost effective cleaning process may be used to clean a silicon containing substrate.

In one embodiment, it is desirable to not rinse or clean the substrate 310 after the processes in box 506 have been performed and before the processes in boxes 507 and/or 508 are performed to avoid the added time required to rinse and dry the substrate, prevent an increase in the cost-of-ownership that is associated with performing wet processing steps, and the added chance of oxidizing or contaminating the substrate surface. In one example, the substrate surface need not be cleaned when the metal containing ink 390 formulation does not contain a residue forming material, such as polyphosphoric acid, polyethylene glycol, or other similar materials.

Figure 4C:
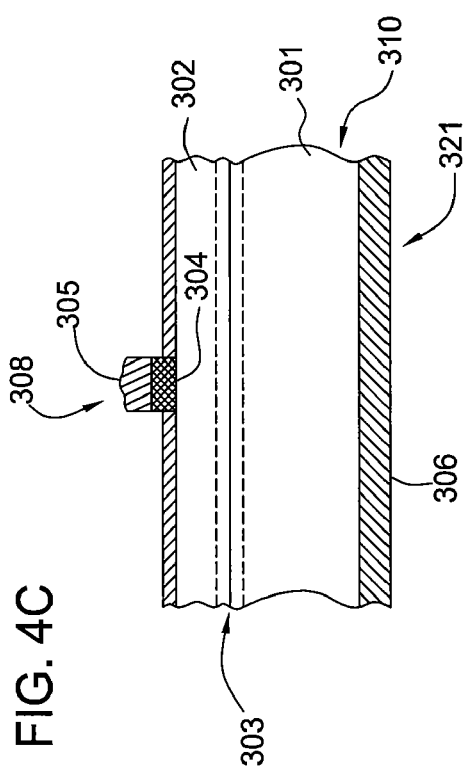
Figure 5:
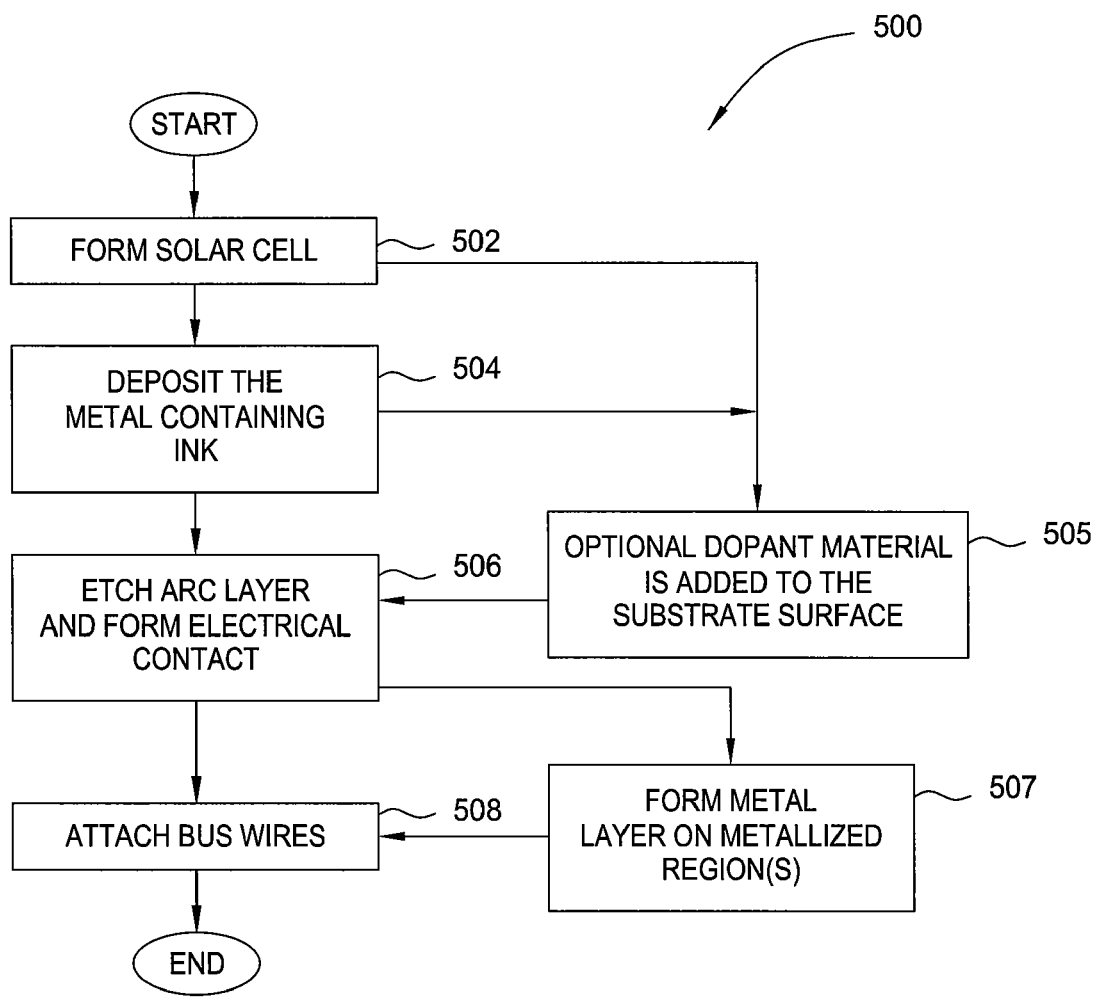
FIG. 5 illustrates a flow chart of methods to metalize a solar cell according to embodiments of the invention.

In step 507, as illustrated in FIG. 4C, a conducting layer 305 is optionally deposited on the contact layer 304 to form the major electrically conducting part of the contact structure 308. In one embodiment, the formed conducting layer 305 is between about 2000 and about 50,000 angstroms (Å) thick and contains a metal, such as copper (Cu), silver (Ag), gold (Au), tin (Sn), cobalt (Co), rhenium (Rh), nickel (Ni), zinc (Zn), lead (Pb), palladium (Pd), and/or aluminum (Al). In one embodiment, the conducting layer 305 is formed by depositing silver (Ag) on the contact layer 304 using an electroless silver deposition process that inherently selectively forms a metal layer on the contact layer 304.

In step 508, as illustrated in FIG. 4D, optionally a bus wire 330 is attached to at least a portion of the contact structure 308 to allow portions of the solar cell device to be connected to other solar cells or external devices. In general, the bus wire 330 is connected to the contact structure 308 using a soldering material 331 that may contain a solder material (e.g., Sn/Pb, Sn/Ag). In one embodiment, the bus wire 330 is between about 2 microns thick and contains a metal, such as copper (Cu), silver (Ag), gold (Au), tin (Sn), cobalt (Co), rhenium (Rh), nickel (Ni), zinc (Zn), lead (Pb), palladium (Pd), and/or aluminum (Al). In one embodiment, the bus wire is coated with a solder material, such as a Sn/Pb or Sn/Ag solder material.

In one embodiment, steps 504 and 506 may be changed to provide an alternate technique that is used to form the contact structure 308. In the alternate version of step 504, rather than selectively depositing the metal containing ink 390 on the surface of the ARC layer 311 the ink is spread or deposited across the surface 320 of the substrate 310, or over desired regions of the substrate, by use of a simple spin-on, spray-on, dipping, or other similar technique. In the alternate version of step 506, a beam of energy, such optical radiation (e.g., laser beam) or an electron beam, is delivered to the surface of the substrate to selectively heat regions of the substrate to causes the chemicals in the ink in these regions to etch the ARC layer 311 and metalize the underlying surface 302A of the substrate. In one embodiment, the delivery of a beam of energy causes the a nickel containing metal containing ink 390 in the heated regions to etch a silicon nitride (SiN) containing ARC layer 311 and form a nickel silicide ($Ni_xSi_y$) on the surface of the upper surface of the substrate 310, such as the n-type emitter region 302. The unheated regions of the ink may then be rinsed from the surface of the substrate if desired.

Doped Contact Metallization Process

In one embodiment of the process sequence 500, an etchant and/or dopant containing material (e.g., a phosphorous containing material) is disposed on the surface of the substrate to etch and/or dope a region of the underlying surface 302A during the subsequent step 506. In one embodiment, a doping material is added to the metal containing ink solution 390, discussed above, so that an improved metal to silicon interface can be formed.

Referring to FIG. 5, in step 505 one or more doping materials (e.g., n-type or p-type dopants) is spread or deposited across the face of the substrate, or over desired regions of the substrate, by use of a simple spin-on, spray-on, dip or other similar technique. In one example, an n-type doping material may comprise polyacrylic acid $(CH_2CHCOOH)_x$, and hypophosphorous acid $(H_3PO_2)$ is spread over a surface of a substrate. In one embodiment, the doping material also contains a dye or pigment material that is used to highlight the different types of dopant materials (e.g., n-type or p-type dopants) that are disposed on the substrate surface.

Next, in an alternate version of step 506, a beam of energy, such optical radiation (e.g., laser beam) or an electron beam, is delivered to the surface of the substrate to selectively heat regions of the substrate to remove the ARC layer 311 from the surface of the substrate, but also cause the chemicals in the doping material to react and dope the materials within the underlying surface 302A of the substrate 310.

In the next step a conductive contact layer 304 is formed on the exposed regions of the substrate. In one embodiment, an electroless nickel deposition process is used to form the contact layer 304 that comprises a primarily pure nickel layer that is between about 10 and about 3500 angstroms (Å) thick over the doped regions. In some cases, the deposited film may contain a high amount of phosphorus (e.g., about 5% P). Further, contents of a bath for the electroless nickel deposition process may include nickel sulfate ($NiSO_4$), ammonium fluoride ($NH_4F$), hydrogen fluoride (HF), and hypophosphite ($H_2PO_2^-$). For example, the bath may be at 60° C. and include about 15 grams per liter (g/L) of $NiSO_4$, 25 g/L of $NH_4F$, and 25 g/L of ammonium hypophosphite ($NH_4H_2PO_2$) and be exposed to the substrate surface for about 2 minutes. An example of an exemplary preparation and electroless nickel deposition process is further described in the commonly assigned U.S. patent application Ser. No. 11/553,878, filed Oct. 27, 2006, and the commonly assigned U.S. patent application Ser. No. 11/385,041, filed Mar. 20, 2006, which are both herein incorporated by reference. In one embodiment, the electroless nickel deposition process may be completed at a temperature between about 75-85° C. and use a solution containing about 25 grams of nickel acetate (Ni(OOC$CH_3)_2$.$4H_2O$), 50 grams of 42% hypophosphorous acid ($H_3PO_2$), and enough ethylenediamine to achieve a pH of 6.0, which is added to a 6:1 BOE solution. The deposition rate that can be achieved is generally between 250-300 angstrom/minute. The commonly assigned U.S. Patent Application Publication Numbers US2007/0099806 and US2007/0108404, which are herein incorporated by reference, describe exemplary BOE solutions and etching processes that may be used with one or more of the embodiment described herein.

In the next step a conducting layer 305 is optionally deposited on the contact layer 304 to form the major electrically conducting part of the contact structure 308. In one embodiment, the formed conducting layer 305 is between about 2000 and about 50,000 angstroms (Å) thick and contains a metal, such as copper (Cu), silver (Ag), gold (Au), tin (Sn), cobalt (Co), rhenium (Rh), nickel (Ni), zinc (Zn), lead (Pb), palladium (Pd), and/or aluminum (Al). In one embodiment, a copper (Cu) containing conducting layer 305 is deposited on the contact layer 304 by use of an electrochemical plating process (e.g., copper deposition, silver deposition). An example of an exemplary electroplating process is further described in the commonly assigned U.S. patent application Ser. No. 11/552,497, filed Oct. 24, 2006, and the commonly assigned U.S. patent application Ser. No. 11/566,205, filed Dec. 1, 2006, which are both herein incorporated by reference. In general, it is desirable to make electrical contact during the electrochemical plating process to regions of the bus bars 309B (FIG. 3B) near the edge of the substrate 310, since they are generally sized to carry current and thus allow uniform deposition of conducting layer 305 over the widely-spaced thin metal lines 309A and the larger bus bars 309B. In another embodiment, the conducting layer 305 is formed by depositing silver (Ag) on the contact layer 304 using an electroless silver deposition process that inherently selectively forms a metal layer on the contact layer 304.

In the next step a bus wire 330 may be attached to at least a portion of the contact structure 308 to allow portions of the solar cell device to be connected to other solar cells or external devices. In general, the bus wire 330 is connected to the contact structure 308 using a soldering material 331 that may contain a solder material (e.g., Sn/Pb, Sn/Ag). In one embodiment, the bus wire 330 is about 200 microns thick and contains a metal, such as copper (Cu), silver (Ag), gold (Au), tin (Sn), cobalt (Co), rhenium (Rh), nickel (Ni), zinc (Zn), lead (Pb), palladium (Pd), and/or aluminum (Al). In one embodiment, each of the buss wires 330 are formed from a wire that is about 30 gauge (AWG: ~0.254 mm) or smaller in size. In one embodiment, the bus wire is coated with a solder material, such as a Sn/Pb or Sn/Ag solder material.

While the foregoing is directed to embodiments of the present invention, other and further embodiments of the invention may be devised without departing from the basic scope thereof, and the scope thereof is determined by the claims that follow.

What is claimed is:

1. A method of forming a solar cell device, comprising:
   forming a dielectric layer on a surface of a substrate;
   disposing an etchant material on a plurality of regions of the dielectric layer, wherein the etchant material further comprises ammonium fluoride and a doping material that contains an element selected from the group consisting of phosphorous, boron, arsenic, antimony, aluminum, indium and gallium;
   heating the substrate to a desired temperature to causes the etchant material to remove at least a portion of the dielectric layer in the plurality of regions to expose a plurality of regions of the surface of the substrate; and
   depositing a conducting layer on the plurality of exposed regions of the surface.

2. A method of forming a solar cell device, comprising:
   forming a dielectric layer on a surface of a substrate;
   disposing an etchant material on a plurality of regions of the dielectric layer, wherein the etchant material comprises ammonium fluoride and a surfactant selected from a group consisting of polyethylene glycol, polypropylene glycol, polyethylene glycol-polypropylene glycol-block-copolymer, and glycerin;
   heating the substrate to a desired temperature to causes the etchant material to remove at least a portion of the dielectric layer in the plurality of regions to expose a plurality of regions of the surface of the substrate; and
   depositing a conducting layer on the plurality of exposed regions of the surface.

3. The method of claim 1, wherein the doping material is a material selected from a group consisting of phosphoric acid ($H_3PO_4$), phosphorous acid ($H_3PO_3$), hypophosphorous acid ($H_3PO_2$), ammonium phosphite ($NH_4H_2PO_3$), and ammonium hypophosphite ($NH_4H_2PO_2$), boric acid ($H_3BO_3$), and ammonium tetrafluoroborate ($NH_4BF_4$).

4. A method of forming a solar cell device, comprising:
   forming a dielectric layer on a surface of a substrate;
   disposing an etchant material on a plurality of regions of the dielectric layer, wherein the etchant material comprises a doping material;
   heating the substrate to a desired temperature to causes the etchant material to remove at least a portion of the dielectric layer in the plurality of regions to expose a plurality of regions of the surface of the substrate,
   wherein the heating the substrate comprises heating the substrate to a temperature greater than about 800° C.; and
   depositing a conducting layer on the plurality of exposed regions of the surface.

5. The method of claim 2, wherein the etchant material further comprises a doping material, and the heating the substrate comprises heating the substrate to a first temperature between about 50° C. and 300° C. and then heating the substrate to a second temperature greater than about 800° C.

6. A method of forming a solar cell device, comprising:
   forming a dielectric layer on a surface of a substrate, wherein the dielectric layer comprises an amorphous silicon layer, and a silicon oxide layer or a silicon nitride layer;
   disposing an etchant material on a plurality of regions of the dielectric layer;
   heating the substrate to a desired temperature to causes the etchant material to remove at least a portion of the dielectric layer in the plurality of regions to expose a plurality of regions of the surface of the substrate; and
   depositing a conducting layer on the plurality of exposed regions of the surface.

7. The method of claim 2, wherein the dielectric layer comprises silicon oxide or silicon nitride that is formed over the surface of the substrate which comprises a crystalline silicon substrate.

8. The method of claim 7, wherein the dielectric layer further comprises an amorphous silicon layer.

9. The method of claim 2, wherein the plurality of regions comprise an array of features that are greater than about 100 micrometers in size, and are spaced at less than about 2 mm centers.

10. The method of claim 2, wherein the plurality of regions comprise an array of features that are less than about 1000 micrometers in size.

11. A method of forming a solar cell device, comprising:
    forming a dielectric layer on a surface of a substrate, wherein the dielectric layer comprises one or more doping elements;
    disposing an etchant material on a plurality of regions of the dielectric layer, wherein the etchant material comprises ammonium fluoride;
    heating the substrate to a desired temperature to causes the etchant material to remove at least a portion of the dielectric layer to form a plurality of exposed regions of the surface of the substrate; and
    depositing a conducting layer on the plurality of exposed regions.

12. The method of claim 11, wherein the conducting layer comprises aluminum, nickel, titanium, tantalum, chromium, tungsten, copper, silver, tin, zinc, lead, and molybdenum.

13. The method of claim 11, wherein the heating comprises heating the substrate to a temperature greater that about 800° C.

14. The method of claim 11, wherein the etchant material further comprises a material selected from a group consisting of phosphoric acid ($H_3PO_4$), phosphorous acid ($H_3PO_3$), hypophosphorous acid ($H_3PO_2$), ammonium phosphite ($NH_4H_2PO_3$), and ammonium hypophosphite ($NH_4H_2PO_2$), boric acid ($H_3BO_3$), and ammonium tetrafluoroborate ($NH_4BF_4$).

15. The method of claim 11, wherein the etchant material further comprises one or more doping elements that are selected from the group consisting of phosphorous, boron, arsenic, antimony, aluminum, indium and gallium.

16. The method of claim 11, wherein the etchant material further comprises a surfactant selected from a group consisting of polyethylene glycol, polypropylene glycol, polyethylene glycol-polypropylene glycol-block-copolymer, and glycerin.

17. The method of claim 11, wherein the heating comprises heating the substrate to a first temperature between about 50° C. and 300° C. and then heating the substrate to a second temperature greater than about 800° C.

18. The method of claim 11, wherein the dielectric layer is formed over a crystalline silicon substrate, and the dielectric layer comprises silicon oxide or silicon nitride.

19. The method of claim 18, wherein the dielectric layer further comprises an amorphous silicon layer.

20. The method of claim 11, wherein plurality of exposed regions comprise an array of features that are greater than about 100 micrometers in size, and are spaced at less than about 2 mm centers.

21. The method of claim 11, wherein plurality of exposed regions comprise an array of features that are less than about 1000 micrometers in size.

22. The method of claim 11, wherein each of the plurality of exposed regions of the surface comprise a silicon containing region.

23. The method of claim 6, wherein the etchant material comprises ammonium fluoride.

* * * * *

UNITED STATES PATENT AND TRADEMARK OFFICE
CERTIFICATE OF CORRECTION

| | | |
|---|---|---|
| PATENT NO. | : 7,888,168 B2 | Page 1 of 1 |
| APPLICATION NO. | : 12/274023 | |
| DATED | : February 15, 2011 | |
| INVENTOR(S) | : Weidman et al. | |

It is certified that error appears in the above-identified patent and that said Letters Patent is hereby corrected as shown below:

Column 13, Claim 1, Line 27, please delete "further".

Signed and Sealed this
Tenth Day of May, 2011

David J. Kappos
*Director of the United States Patent and Trademark Office*